US007663887B2

(12) United States Patent
Li

(10) Patent No.: US 7,663,887 B2
(45) Date of Patent: Feb. 16, 2010

(54) HEAT DISSIPATION DEVICE ASSEMBLY WITH RETAINER DEVICE

(75) Inventor: Dong-Yun Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 190 days.

(21) Appl. No.: 11/861,674

(22) Filed: Sep. 26, 2007

(65) Prior Publication Data

US 2009/0052140 A1 Feb. 26, 2009

(30) Foreign Application Priority Data

Aug. 24, 2007 (CN) ............ 2007 1 0076561

(51) Int. Cl.
*H05K 7/20* (2006.01)
(52) U.S. Cl. ............ 361/720; 165/80.3; 174/16.3; 257/E23.086
(58) Field of Classification Search ........... 361/679.48, 361/703–704, 709, 715, 719–720
See application file for complete search history.

(56) References Cited

U.S. PATENT DOCUMENTS

| 6,008,990 A | * | 12/1999 | Liu .................. 361/704 |
| 6,249,436 B1 | * | 6/2001 | Bollesen .............. 361/720 |
| 7,142,430 B2 | | 11/2006 | Lee et al. |
| 2005/0195572 A1 | * | 9/2005 | Franz et al. ............ 361/707 |

* cited by examiner

*Primary Examiner*—Jayprakash N Gandhi
*Assistant Examiner*—Courtney Smith
(74) *Attorney, Agent, or Firm*—Frank R. Niranjan

(57) ABSTRACT

A heat dissipation device assembly includes a heat dissipation device mounted on a printed circuit board and a retainer device mounted below the printed circuit board. The retainer device includes a back plate and a crank pivotably mounted to the back plate. The crank includes a pressing portion and a handle for receiving a rotation force. Posts are extended from the heat dissipation device through the printed circuit board to engage with the back plate, thereby to pre-assemble the heat dissipation device on the printed circuit board. The handle is pushed to rotate between a released position and a locked position. In the locked position, the pressing portion extends through the back plate to push the printed circuit board toward the heat dissipation device, whereby an electronic component on the printed circuit board has an intimate contact with the heat dissipation device.

17 Claims, 5 Drawing Sheets

HEAT DISSIPATION DEVICE ASSEMBLY WITH RETAINER DEVICE

BACKGROUND OF THE INVENTION

1. Field of the Invention

The present invention relates to a heat dissipation device assembly, and particularly to a heat dissipation device assembly with a retainer device, which can readily and securely retain a heat dissipation device on an electronic component mounted on a printed circuit board.

2. Description of related art

Developments in integrated circuits have resulted in greater circuit density and complexity, thus increasing heat generated by operation of such integrated circuits within an electronic package. Therefore, bigger and heavier heat sinks are becoming increasingly necessary to efficiently remove the heat. Nowadays, strong resilient clips are often used to attach heat sinks onto electronic components. Accordingly, the force required to keep a heat sink in place has also increased. Unfortunately, in assembly, operators must exert great manual force when attaching the clip to the socket or to the motherboard. Extra tools are often required for installation or removal of the clip. There is considerable risk that during use of such tools, nearby components such as a motherboard will be accidentally damaged.

What is needed, therefore, is a heat dissipation device assembly with a retainer device, which can conveniently and safely secure the heat dissipation device assembly to a printed circuit board to have an intimate contact with an electronic component mounted on the printed circuit board.

SUMMARY OF THE INVENTION

A heat dissipation device assembly comprises a heat dissipation device and a retainer device. The heat dissipation device is used to be mounted on a printed circuit board, and has a plurality of posts extending therefrom. The retainer device is used to be mounted below the printed circuit board at a location opposite the heat dissipation device. The retainer device comprises a back plate having an opening defined therein and a crank. The crank comprises a pressing portion protruding into the opening, two pivot arms extending from opposite ends of the pressing portion and pivotably connected to the back plate, and a handle extending from one end of one of the pivot arms. The posts are extended through the printed circuit board and engage with the back plate to pre-assemble the heat dissipation device on the printed circuit board. The handle is pushed to rotate between a released position, in which the printed circuit board is loosely held between the heat dissipation device and the back plate, and a locked position, in which the pressing portion pushes the printed circuit board toward a heat sink of the heat dissipation device to cause the printed circuit board to be firmly held between the heat dissipation device and the back plate. At the locked position, the heat sink has an intimate contact with an electronic component mounted on the printed circuit board.

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
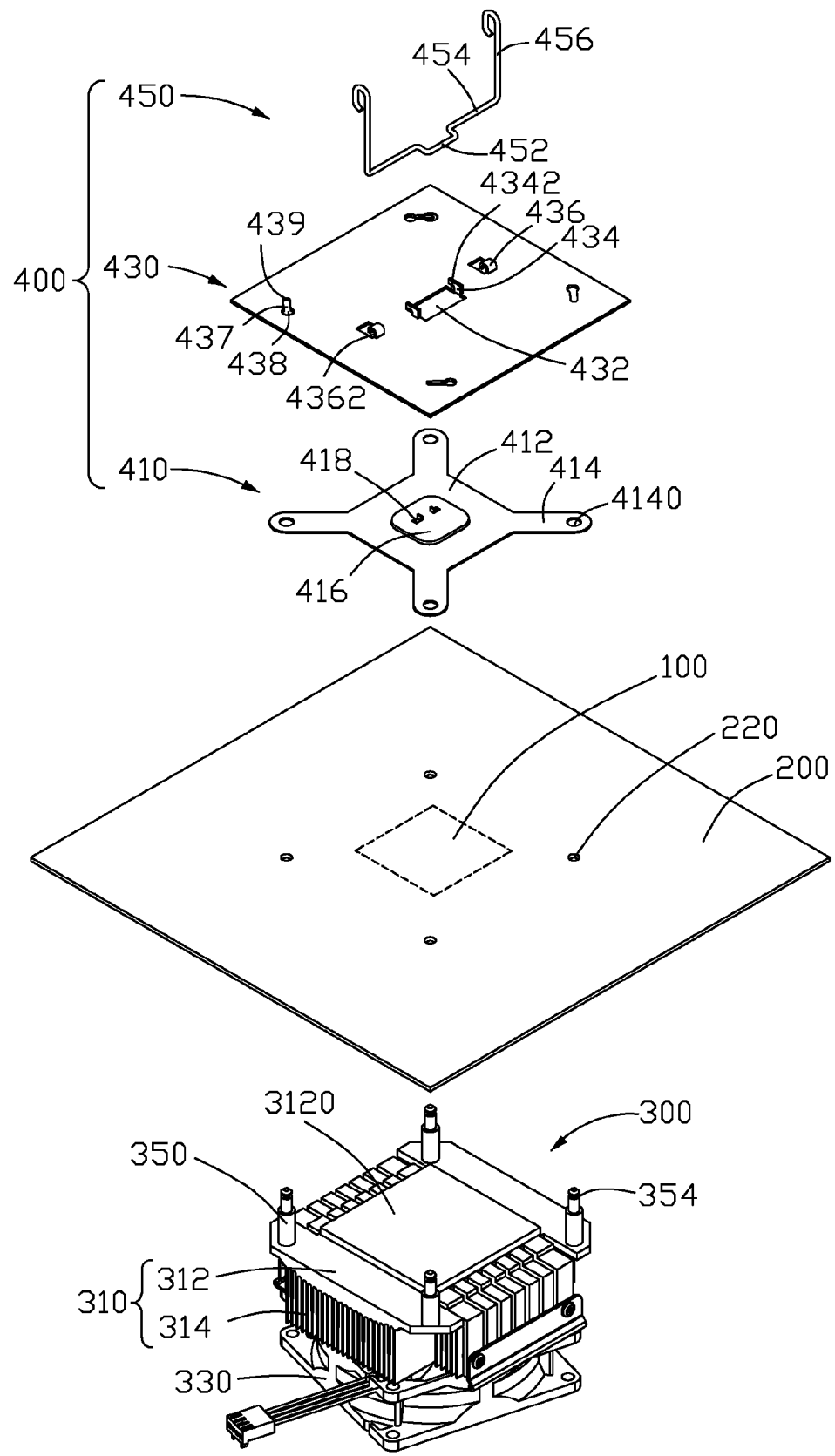
FIG. 1 is an exploded, isometric view of a heat dissipation device assembly in accordance with a preferred embodiment of the present invention, together with an electronic component mounted on a printed circuit board.

Referring to FIG. 1, a heat dissipation device assembly in accordance with a referred embodiment of the invention is illustrated. The heat dissipation device assembly is for cooling an electronic component 100 (shown in dotted line) mounted on a bottom surface of a printed circuit board 200. The printed circuit board 200 defines a plurality of through holes 220 surrounding the electronic component 100 for mounting the heat dissipation device assembly thereon.

The heat dissipation device assembly comprises a heat dissipation device 300 located below the bottom surface of the printed circuit board 200, and a retainer device 400 located above a top surface of the printed circuit board 200.

The heat dissipation device 300 comprises a heat sink 310 and a fan 330. The heat sink 310 has a base 312 with a top surface 3120 attached to the electronic component 100 and a plurality of fins 314 mounted on a bottom surface of the base 312. The fan 330 is mounted on a bottom surface of the heat sink 310 to blow airflow upwardly through the fins 314.

Figure 2:
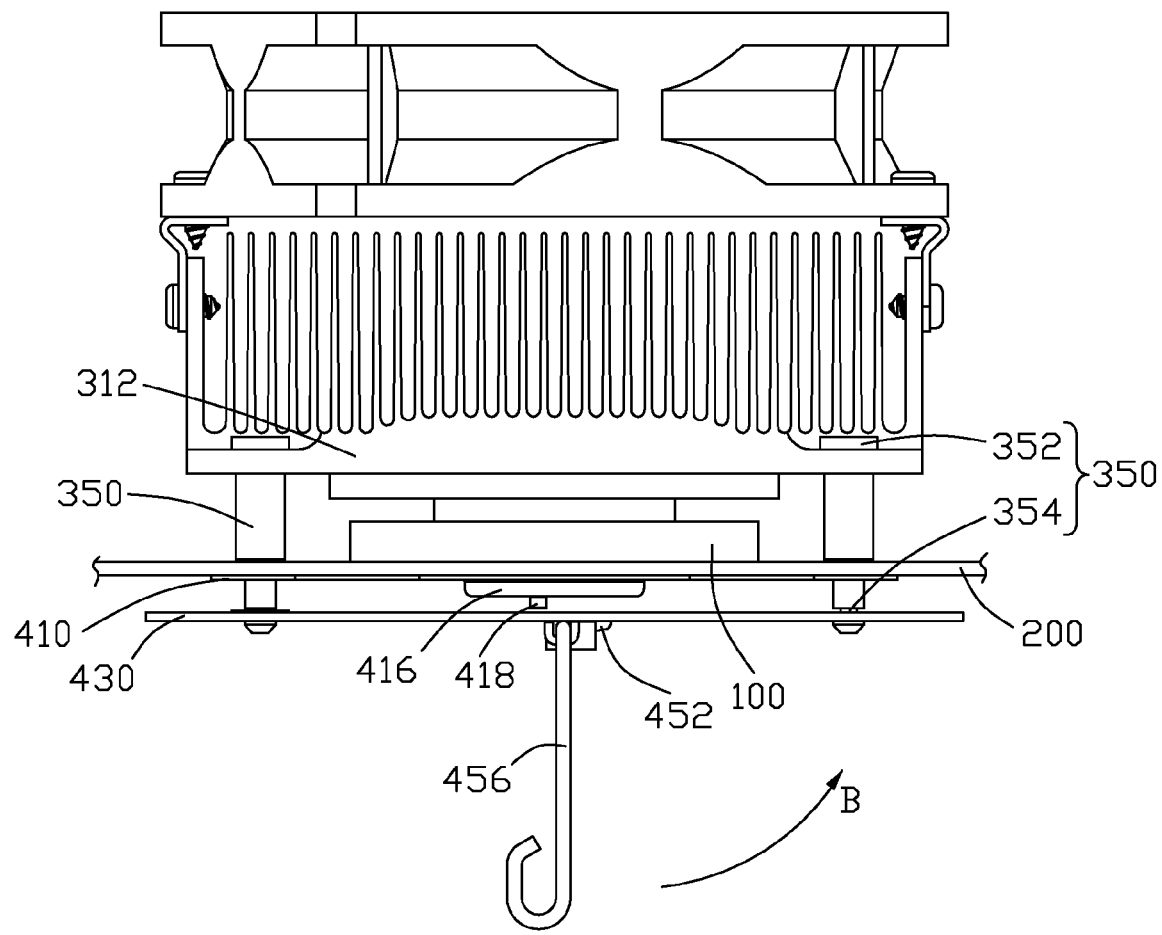
FIG. 2 is an assembled view of FIG. 1, wherein a retainer device of the heat dissipation device assembly is in a released position.

The heat dissipation device 300 further comprises a plurality of posts 350 extending through corners of the base 312, respectively. Referring to FIG. 2, each post 350 comprises a head 352 formed at a bottom end thereof and a neck 354 formed above the head 352. The heat dissipation device 300 is secured on the printed circuit board 200 via engagement of the posts 350 with both of the base 312 and the retainer device 400. In detail, the heads 352 of the posts 350 abut against the bottom surface of the base 312, and the necks 354 of the posts 350 extend through corresponding through holes 220 of the printed circuit board 200 to engage with the retainer device 400.

The retainer device 400 comprises a cross-shaped base plate 410, a rectangular back plate 430 and a crank 450. The base plate 410 is attached to the top surface of the printed circuit board 200. The back plate 430 is stacked on the base plate 410 and engages with the necks 354 of the posts 350. The crank 450 is pivotably connected to the back plate 430. The crank 450 is driven to rotate between a released position and a locked position to detach the heat dissipation device 300 from or attach the heat dissipation device 300 to the printed circuit board 200. The detailed structures of the retainer device 400 will be described in the following text.

The base plate 410 has a rectangular central portion 412 and four fingers 414. The fingers 414 extend radially and outwardly from corresponding corners of the central portion 412. A rectangular protrusion 416 protrudes upwardly from the central portion 412 towards the back plate 430. Two spaced stoppers 418 are stamped upwardly from the protrusion 416 and point to the back plate 430. Each finger 414 defines a through hole 4140 in a free end portion thereof. When the base plate 410 is attached to the printed circuit board 200, the through holes 4140 of the base plate 410 align with corresponding through holes 220 of the printed circuit board 200 so that the posts 350 can extend successively through the through holes 220 of the printed circuit board 200 and the through holes 4140 of the base plate 410 to engage with the back plate 430.

The back plate 430 is larger than the base plate 410 and covers the base plate 410. The back plate 430 has a rectangular opening 432 defined in a center thereof. The opening 432 is corresponding to the stoppers 418 of the base plate 410, and the stoppers 418 protrude into the opening 432. Two receiving projections 434 are stamped upwardly from the back plate 430 and located adjacent to opposite edges of the opening 432. Each receiving projection 434 defines a notch 4342 therein. Two latches 436 are formed on the back plate 430, and located at opposite sides of the opening 432. The two receiving projections 434 are located between the two latches 436. Each latch 436 has an arced configuration, with a pivot hole 4362 defined therein. The pivot holes 4362 of the latches 436 and the notches 4342 of the receiving projections 434 are arranged in a line for receiving the crank 450, which is rotatably received in the pivot holes 4362 and the notches 4342.

The back plate 430 further has four curved slots 437 defined in corresponding corners thereof for engagingly receiving the posts 350. Each slot 437 has a width smaller than a diameter of the neck 354. Each slot 437 has a first end terminated with a first through hole 438, which has a diameter larger than that of the neck 354, and a second end terminated with a second through hole 439, which has a diameter smaller than that of the neck 354.

Figure 3:
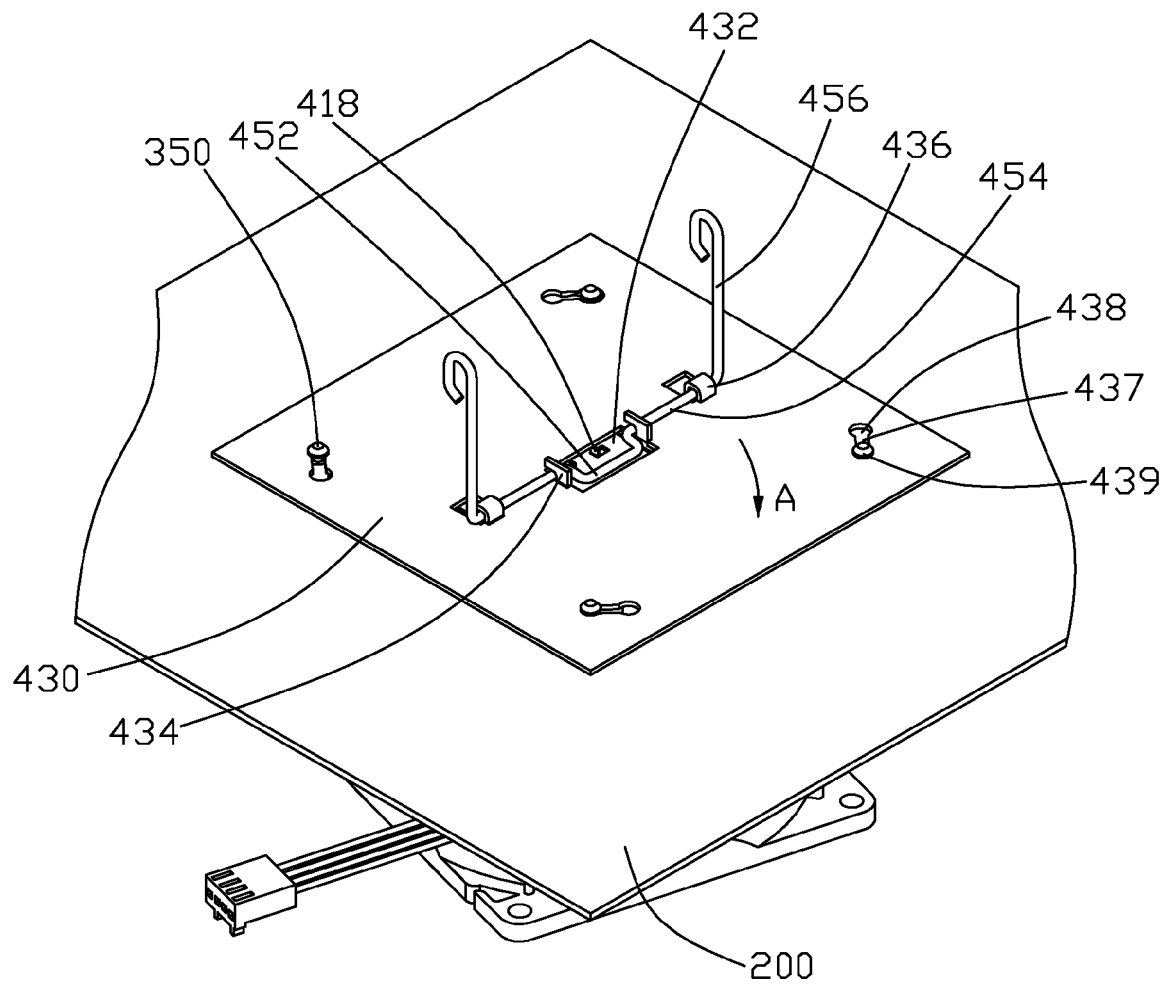
FIG. 3 is similar to FIG. 2, viewed from another aspect.

The curved slots 437 are arranged in a circle round a center of the back plate 430 with the first through holes 438 and the second through holes 439 alternately arranged in the circle. As a result, the necks 354 can extend through corresponding first through holes 438. Then the posts 350 can rotate relative to the back plate 430 along corresponding slots 437 when the back plate 430 is operated to rotate relative to the base plate 410 and the printed circuit board 200 along a first direction A as shown in FIG. 3, i.e. clockwise direction in a plane parallel to the back plate 430. When the posts 350 reach to corresponding second through holes 439, the necks 354 engage with the back plate 430 defining the second through holes 439 to prevent the posts 350 from disengaging from the back plate 430 unless the back plate 430 is driven to rotate reversely. Thus, the heat dissipation device assembly is pre-assembled on the printed circuit board 200 via the engagement of the posts 350 and the back plate 430 of the retainer 400. After that, the heat dissipation device assembly can be firmly secured on the printed circuit board 200 via rotation of the crank 450. The detailed structures and operation of the crank 450 will be described in the following text.

The crank 450 is made by bending a metal wire and comprises an offset pressing portion 452, two pivot arms 454 extending from opposite ends of the pressing portion 452, and two handles 456 extending from corresponding ends of the pivot arms 454. The handles 456 facilitate operation of the crank 450.

The crank 450 is pivotably connected to the back plate 430 in such a manner that opposite ends of each pivot arm 454 are rotatably received in one corresponding pivot hole 4362 and one notch 4342 adjacent to the corresponding pivot hole 4362. Meanwhile, the pressing portion 452 is positioned between the two receiving projections 434 and protrudes into the opening 432 to abut against the rectangular protrusion 416.

As mentioned above, the heat dissipation device assembly is pre-assembled on the printed circuit board 200 via rotation of the back plate 430, which results in that the necks 354 are locked into the corresponding second through holes 439. The heat dissipation device assembly then can be firmly secured on the printed circuit board 200 via rotation of the crank 450 from the released position to the locked position.

As shown in FIGS. 2-3, the crank 450 of the retainer device 400 is in the released position. In this released position, the handle 456 is perpendicular to the back plate 430 with the pressing portion 452 spaced from the base plate 410. The printed circuit board 200 is loosely held between the heat dissipation device 300 and the back plate 430.

In operation, each handle 456 is pushed to rotate along a direction B as shown in FIG. 2, i.e. counterclockwise direction in a plane perpendicular to the back plate 430; thus, the handles 456 pivot about an axis of the pivot arms 454 to cause the distance between the pressing portion 452 and the rectangular protrusion 416 to gradually decrease. As the handles 456 are continuously pushed so that the distance between the pressing portion 452 and the rectangular protrusion 416 is continuously decreased, the pressing portion 452 contacts with the rectangular protrusion 416 and is resiliently deformed. At the same time, the pressing portion 452 applies a gradually increased force on the rectangular protrusion 416 to push the base plate 410 to move towards the printed circuit board 200. Meanwhile, the distance between the printed circuit board 200 and the back plate 430 is gradually increased; as a result, the back plate 430 applies a gradually increased force on the posts 350, which causes the base 312 of the heat sink 310 to move toward the electronic component 100 to thereby have a close contact therewith.

Figure 4:
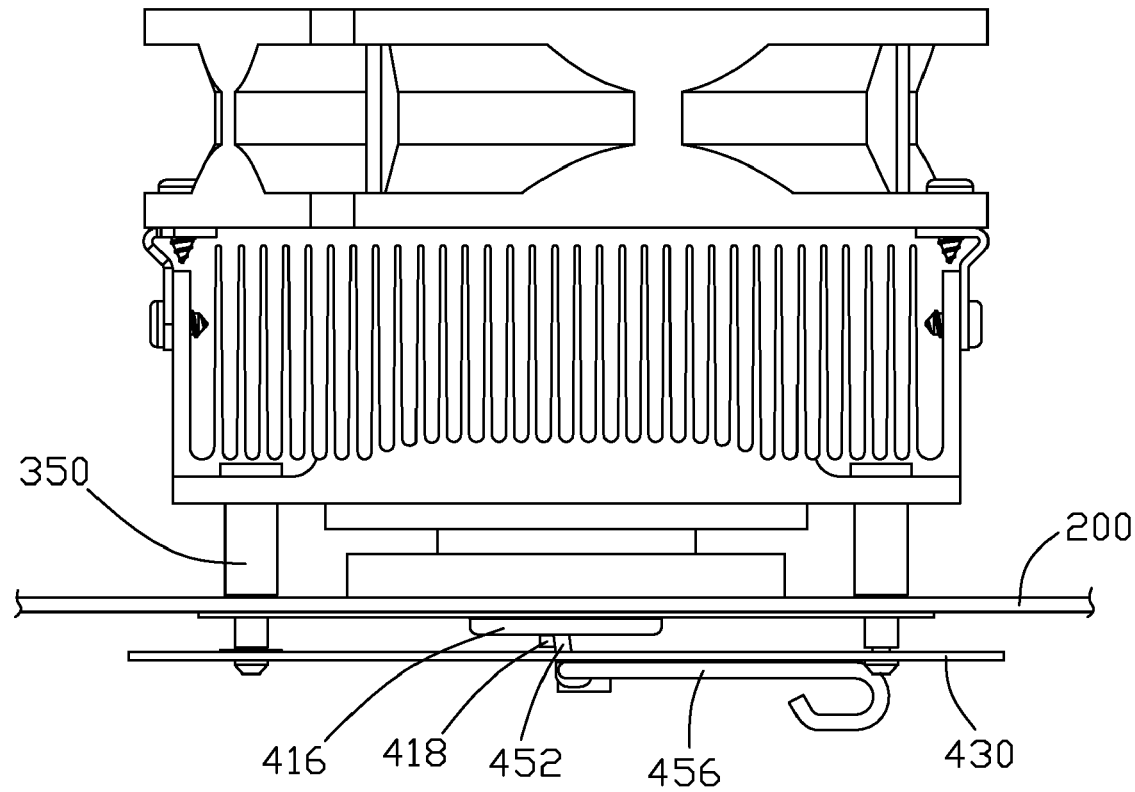
FIG. 4 is an assembled view of FIG. 1, wherein the retainer device of the heat dissipation device assembly is in a locked position.
Figure 5:
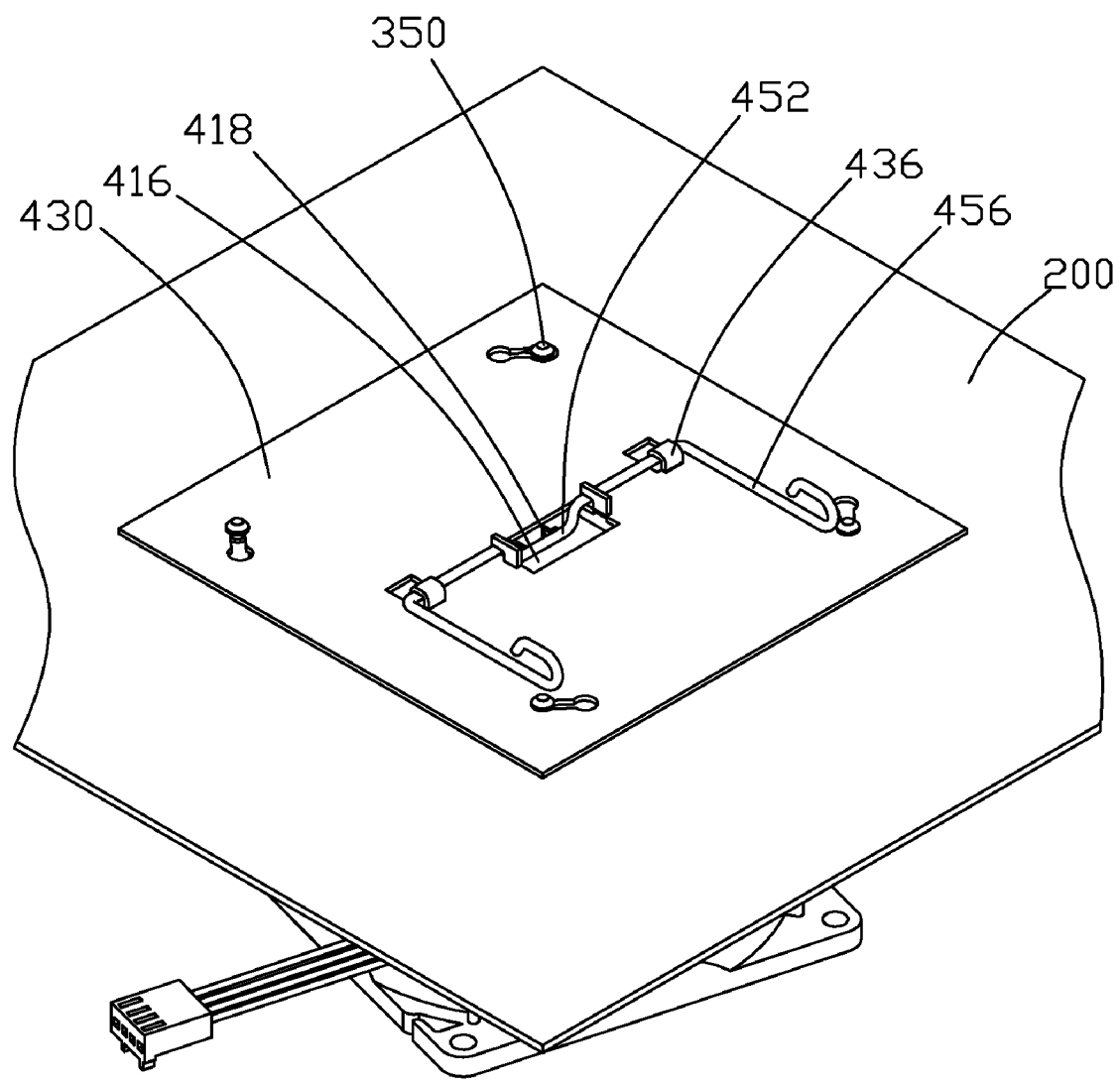
FIG. 5 is similar to FIG. 4, viewed from another aspect.

When the handles 456 rotate to touch the back plate 430 as shown in FIGS. 4-5, the pressing portion 452 abuts against the stoppers 418 and the crank 450 of the retainer device 400 is in the locked position. In this locked position, the distance between the printed circuit board 200 and the back plate 430 is so large that the back plate 430 applies a large force on the posts 350, which causes the base 312 of the heat sink 310 to tightly contact with the electronic component 100.

Furthermore, referring to FIG. 4, when the crank 450 is in the locked position, the pressing portion 452 and the handles 456 are located at opposite sides of the pivot arms 454; thus, a lever is formed by the crank 450. The pivot arms 454 function as a fulcrum of the lever, the pressing portion 452 functions as a resistance arm of the lever, and the handles 456 function as an effort arm of the lever. Therefore, in the locked position, the base plate 410 acts on the pressing portion 452 to prevent the handles 456 from spontaneously returning to the released position, unless the handle 456 is driven to rotate by a user in a direction opposite to the direction B in FIG. 2. Thus it can be seen that the retainer device 400 stably secures the heat dissipation device 300 onto the electronic component 100.

Additionally, a friction force, which exists between the necks 354 and edges of the second through holes 439 of the back plate 430, serves to prevent the back plate 430 from rotating relative to the printed circuit board 200 along a direction opposite to the direction A as shown in FIG. 3.

To detach the heat dissipation device 300 from the printed circuit board 200, the handles 456 are first turned from the locked position to the released position along the direction opposite to the direction B of FIG. 2. Then, the back plate 430 is forced to rotate along the direction opposite the direction A of FIG. 3, thereby causing the posts 350 to move along the corresponding slots 437 to the first through holes 438 of the back plate 430. Thereafter, the posts 350 of the heat sink 310 are pulled out of the first through holes 438 of the back plate 430, the through holes 4140 of the base plate 410 and the through holes 220 of the printed circuit board 200. Thus, the heat dissipation device 300 is disassembled from the printed circuit board 200 and the electronic component 100.

In the heat dissipation device assembly as described above, the base plate 410 is used to increase the strength of the printed circuit board 200 and bear the pressing portion 452 of the crank 450. However, in another embodiment, the base plate 410 may be omitted and the pressing portion 452 can directly abut against the printed circuit board 200 to secure the heat dissipation device 300 on the printed circuit board 200.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device assembly comprising:
   a heat dissipation device adapted to be positioned above a printed circuit board, the heat dissipation device having a plurality of posts extending therefrom; and
   a retainer device adapted to be positioned below the printed circuit board, the retainer device comprising:
   a back plate having an opening defined therein; and
   a crank comprising a pressing portion protruding into the opening, two pivot arms extending from opposite ends of the pressing portion and pivotably connected to the back plate, and a handle extending one end of one of the pivot arms;
   wherein the posts are adapted to extend through the printed circuit board and engage with the back plate to pre-assemble the heat dissipation device on the printed circuit board;
   wherein the handle is pushed to rotate between a released position, in which the printed circuit board is loosely held between the heat dissipation device and the back plate, and a locked position, in which the pressing portion pushes the printed circuit board toward the heat dissipation device to cause the printed circuit board to be firmly held between the heat dissipation device and the back plate, and an electronic component on the printed circuit board to have an intimate contact with the heat dissipation device; and
   wherein the back plate comprises two latches located at opposite sides of the opening, each latch having a pivot hole defined therein, the pivot arms being pivotably received in the pivot holes with the pressing portion protruding into the opening.

2. The heat dissipation device assembly as described in claim 1, wherein the crank is made by bending a wire.

3. The heat dissipation device assembly as described in claim 1, wherein the pressing portion of the crank is offset from the pivot arms.

4. The heat dissipation device assembly as described in claim 1, wherein each latch has an arced configuration with the pivot hole defined therein.

5. The heat dissipation device assembly as described in claim 1, wherein the pressing portion is extended into the opening and directly abuts against the printed circuit board when the handle is in the locked position.

6. The heat dissipation device assembly as described in claim 1, wherein the retainer device further comprise a base plate, and the base plate is adapted to be sandwiched between the printed circuit board and the back plate with the posts extending therethrough, the pressing portion of the crank abutting against the base plate when the handle is in the locked position.

7. The heat dissipation device assembly as described in claim 6, wherein the base plate comprises a protrusion protruding therefrom towards the back plate, and the pressing portion abuts against the protrusion of the base plate when the handle is in the locked position.

8. The heat dissipation device assembly as described in claim 7, wherein the base plate further comprises a stopper protruding from the protrusion towards the back plate, and the pressing portion abuts against the stopper when the handle is in the locked position.

9. The heat dissipation device assembly as described in claim 8, wherein the base plate further comprises a plurality of fingers extending therefrom, and each finer defines a through therein for a corresponding post extending therethrough.

10. The heat dissipation device assembly as described in claim 1, wherein the back plate further comprises two receiving projections formed on opposite edges of the opening, the two receiving projections each defining a notch therein, the pivot holes of the latches and the notches of the receiving projections being arranged in a line for receiving the crank, which is rotatably received in the pivot holes and the notches.

11. The heat dissipation device assembly as described in claim 10, wherein opposite ends of each pivot arm are rotatably received in one pivot hole and one notch adjacent to the one pivot hole.

12. The heat dissipation device assembly as described in claim 1, wherein each post has a head mounted on the heat dissipation device, and a neck adapted to extend through the printed circuit board, the back plate having a plurality of curved slots defined therein for engagingly receiving corresponding necks of the posts.

13. The heat dissipation device assembly as described in claim 12, wherein each slot has a first end terminated with a first through hole, which has a diameter larger than a diameter of the neck, and a second end terminated with a second through hole, which has a diameter smaller than the diameter of the neck, and wherein the posts are adapted to extend through corresponding first through holes and move along corresponding slots to lock into corresponding second through holes.

14. The heat dissipation device assembly as described in claim 13, wherein the slots are arranged in a circle with the first through holes and the second through holes alternately arranged in the circle so that the posts can rotate relative to the back plate along corresponding slots when the back plate is operated to rotate relative to the heat dissipation device.

15. The heat dissipation device assembly as described in claim 14, wherein the back plate is operated to rotate relative to the heat dissipation device in a plane parallel to the back plate, thereby causing the posts to move from the corresponding first through holes to the corresponding second through holes, and the handle is operated to rotate relative to the heat dissipation device in a plane perpendicular to the back plate.

16. The heat dissipation device assembly as described in claim 1, wherein the handle and the pressing portion are located at opposite sides of the pivot arms to form a lever when the handle is in the locked position.

17. An electronic assembly comprising:
    a printed circuit board having an electronic component mounted thereon;

a heat dissipation device having a heat sink intimately contacting with the electronic component and a plurality of posts extending from the heat sink through the printed circuit board;

a base plate attached to a side of the printed circuit board opposite the heat dissipation device, wherein the posts extend through the base plate;

a back plate located at a side of the base plate that the base plate is located between the printed circuit board and the back plate, the posts engaging with the back plate, the engagement between the posts and the back plate being releasable by rotating the heat dissipation device relative to the back plate; and a crank rotatably attached to the back plate and movable between locked and released positions, the crank having a pressing portion extending through the back plate and pushing the base plate and the printed circuit toward the heat sink of the heat dissipation device, wherein in the released position, the pressing portion is spaced from the base plate;

wherein the engagement between the posts and the back plate is releasable by rotating the heat dissipation device relative to the back plate on a plane parallel to that the back plate is extended, and the crank is rotatable on a plane perpendicular to that the back plate is extended; and wherein the base plate has a protrusion and a stopper extending toward the back plate, and the pressing portion of the crank abuts against the stopper and the protrusion.

* * * * *